(12) United States Patent
Makino et al.

(10) Patent No.: US 7,551,005 B2
(45) Date of Patent: Jun. 23, 2009

(54) OUTPUT CIRCUIT AND CURRENT SOURCE CIRCUIT USED IN THE SAME

(75) Inventors: Takanori Makino, Ogaki (JP); Kazuyoshi Nagase, Kitanagoya (JP)

(73) Assignee: DENSO CORPORATION, Kariya (JP)

( * ) Notice: Subject to any disclaimer, the term of this patent is extended or adjusted under 35 U.S.C. 154(b) by 133 days.

(21) Appl. No.: 11/586,555

(22) Filed: Oct. 26, 2006

(65) Prior Publication Data
US 2007/0097575 A1    May 3, 2007

(30) Foreign Application Priority Data
Oct. 28, 2005    (JP)    ............................. 2005-313890

(51) Int. Cl.
*H03B 1/00*    (2006.01)
(52) U.S. Cl. .................... 327/108; 327/103; 327/538
(58) Field of Classification Search ......... 327/538–543, 327/108–112, 103; 374/173; 326/82–83
See application file for complete search history.

(56) References Cited

U.S. PATENT DOCUMENTS

| 4,077,012 A | * | 2/1978 | Iwamatsu | .................... 330/253 |
| 5,914,635 A | | 6/1999 | Yamamoto | ................... 327/561 |
| 2005/0093616 A1 | * | 5/2005 | Chen | ........................... 327/538 |

* cited by examiner

*Primary Examiner*—Long Nguyen
(74) *Attorney, Agent, or Firm*—Posz Law Group, PLC

(57) ABSTRACT

An output circuit includes a constant current circuit that generates and supplies a constant current to an output terminal of the output circuit. Based on the constant current, the output circuit converts an input signal to an output signal having a voltage within a voltage range specified by upper and lower clamp voltages. The output signal is feedback to the constant current circuit. The constant current circuit changes the amount of the constant current in accordance with the output signal in such a manner that the constant current increases with an increase in the output signal and becomes zero when the output signal decreases to or below a threshold voltage. Thus, the upper clamp voltage is made as close to a power supply voltage as possible and the lower clamp voltage is made as close to a ground voltage as possible.

15 Claims, 4 Drawing Sheets

OUTPUT CIRCUIT AND CURRENT SOURCE CIRCUIT USED IN THE SAME

CROSS REFERENCE TO RELATED APPLICATION

This application is based on and incorporates herein by reference Japanese Patent Application No. 2005-313890 filed on Oct. 28, 2005.

FIELD OF THE INVENTION

The present invention relates to an output circuit that includes a constant current circuit and that converts an input signal to an output signal having a voltage within a predetermined voltage range based on a constant current generated by the constant current circuit.

BACKGROUND OF THE INVENTION

A signal processing circuit used in, for example, a pressure sensor has an output circuit. A sensor signal of the pressure sensor is output to an external device such as an engine electronic control unit (ECU) through the output circuit. As disclosed in, for example, JP-H9-166620A, the output circuit converts an input signal to an output signal having a voltage within a predetermined voltage range specified by upper and lower clamp (limit) voltages. Thus, the input signal is converted to a suitable voltage signal for the engine ECU.

As shown in FIG. 4, a conventional output circuit 100 includes an amplifier circuit 101, a constant current circuit 102, a filter circuit 103, and resistors 104a-104c. The conventional output circuit 100 is powered by a power supply voltage VCC supplied through the engine ECU. The conventional output circuit 100 converts an input signal VIN applied to an input terminal IN to an output signal VOUT having the voltage within the voltage range specified by the upper and lower clamp voltages and outputs the output signal VOUT to the engine ECU through an output terminal OUT.

The amplifier circuit 101 includes an operational amplifier 101a and resistors 101b, 101c. The amplifier circuit 101 amplifies the input signal VIN with a gain depending on the resistance of the resistors 101b, 101c.

The constant current circuit 102 includes NPN transistors 102a, 102b, PNP transistors 102c, 102d, and resistors 102e-102i. The transistors 102a, 102b construct a first current mirror circuit and the transistors 102c, 102d construct a second current mirror.

The filter circuit 103 includes resistors 103a, 103b and a capacitor 103c and acts as a resistor-capacitor (RC) filter circuit. The filter circuit 103 eliminates high frequency noise corresponding to electromagnetic compatibility (EMC) noise such as magnetic noise coming from other electronic devices and increases resistance of the conventional output circuit 100 to the EMC noise. The filter circuit 103 has a filter constant depending on the resistance of the resistors 103a, 103b and the capacitance of the capacitor 103c. The filter circuit 103 prevents a noise signal within a certain frequency range to enter the conventional output circuit 100 through the output terminal OUT based on the filter constant.

The resistor 104a is used to determine the clamp voltages, to adjust the amount of current flow to the output terminal OUT, and to detect a break in the conventional output circuit 100. The resistor 104b is used to determine the lower clamp voltage. The resistor 104c is used to determine the clamp voltages and to detect the break in the conventional output circuit 100.

The conventional output circuit 100 operates as follows:

When the power supply voltage VCC is applied to the constant current circuit 102, a base-emitter voltage Vbe of the transistor 102a increases. Then, when the base-emitter voltage Vbe exceeds a transistor turn-on voltage Vf (e.g., 0.7 volts), the transistor 102a is turned on and a collector current I11 flows through the transistor 102a. The amount of the collector current I11 depends on the resistance of the resistor 102e. The resistors 102f, 102g act as a balance resistor for the base-emitter voltage Vbe.

When the transistor 102a is turned on, the transistor 102b is turned on and a collector current I12 flows through the transistor 102b because the transistors 102a, 102b construct the first current mirror circuit. As a result, the transistor 102c is turned on and a collector current I13 flows through the transistor 102c. The collector current I13 is almost equal to the collector current I12. The collector current I12 mirrors the collector current I11 by a first mirror ratio of the first current mirror circuit.

When the transistor 102c is turned on, the transistor 102d is turned and a collector current I14 flows through the transistor 102d because the transistors 102c, 102d construct the second current mirror circuit. The collector current I14 mirrors the collector current I13 by a second mirror ratio of the second current mirror circuit.

The collector current I14 is supplied to the output terminal OUT through the resistor 102i. Thus, the constant current circuit 102 continuously supplies a constant current, i.e., the collector current I14 to the output terminal VOUT during normal operation of the conventional output circuit 100.

The upper and lower clamp voltages are determined as follows:

When a voltage of the input signal VIN is higher than a predetermined reference voltage, an output voltage of the operational amplifier 101a is lower than the voltage of the output signal VOUT. As a result, the collector current I14 and a current flowing through the resistor 101b flows into a junction between the resistors 103b, 104.

In this case, for example, when the resistance of the resistor 104c is much larger than a combined resistance of the resistors 103a, 103b, and 104b, most of the current flowing into the junction flows into the operational amplifier 101a through the resistors 103b, 103a, and 104b. A current I15 flowing through the resistor 104a also flows into the operational amplifier 101a through the resistor 104b. These currents flow into a ground GND through the operational amplifier 101a. Thus, the lower clamp voltage is determined as a voltage drop across the resistors 103a, 103b, and 104b.

In contrast, when the voltage of the input signal VIN is lower than the reference voltage, the output voltage of the operational amplifier 101a is higher than the voltage of the output signal VOUT. Therefore, the current flows from the output terminal side of the operational amplifier 101a to the output terminal OUT side.

In this case, when a maximum current is output from the operational amplifier 101a, the maximum current, the collector current I14, and the current I15 flows toward the output terminal OUT side, the resistor 101b side, and the resistor 104c side. Thus, the upper clamp voltage is determined as a voltage drop across the resistor 104c.

The upper and lower clamp voltages specify the voltage range of the output signal VOUT provided to the engine ECU. Therefore, it is preferable that the lower clamp voltage is close to the ground GND (i.e., 0 volt) and the upper clamp voltage is close to the power supply voltage VCC as much as possible.

In the conventional output circuit 100 shown in FIG. 4, whereas the upper clamp voltage may be close to the power supply voltage VCC, the lower clamp voltage may not be close to the ground GND due to the voltage drop across the resistors 103a, 103b, and 104b. Specifically, as shown in FIG. 5, when the voltage of the input signal VIN increases from a voltage Va to a voltage Vb, the voltage of the output signal VOUT changes from 4.8 volts to 0.3 volts.

The lower clamp voltage may be close to the ground GND by eliminating the constant current circuit 102 from the conventional output circuit 100. However, if the conventional output circuit 100 has no constant current circuit 102, the upper clamp voltage may not be close to the power supply voltage VCC.

SUMMARY OF THE INVENTION

In view of the above-described problem, it is an object of the present invention to provide an output circuit for converting an input signal to an output signal having a voltage within a predetermined voltage range specified by an upper clamp voltage made as close to a power supply voltage as possible and a lower clamp voltage made as close to a ground voltage as possible, and to provide a constant current circuit used in the output circuit.

An output circuit includes a constant current circuit that generates a constant current and supplies the constant current to an output terminal of the output circuit. Based on the constant current, the output circuit converts an input signal to an output signal having a voltage within a predetermined voltage range specified by upper and lower clamp voltages.

The output signal is fed back to the constant current circuit. The constant current circuit changes the amount of the constant current in accordance with the voltage of the output signal.

When the voltage of the output signal increases, the constant current circuit increases the amount of the constant current. Thus, the upper clamp voltage is made as close to a power supply voltage as possible.

In contrast, when the voltage of the output signal decreases to or below a predetermined threshold voltage, the constant current circuit is turned off so that the constant current becomes zero. Thus, the lower clamp voltage is made as close to ground voltage as possible.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

Figure 1:
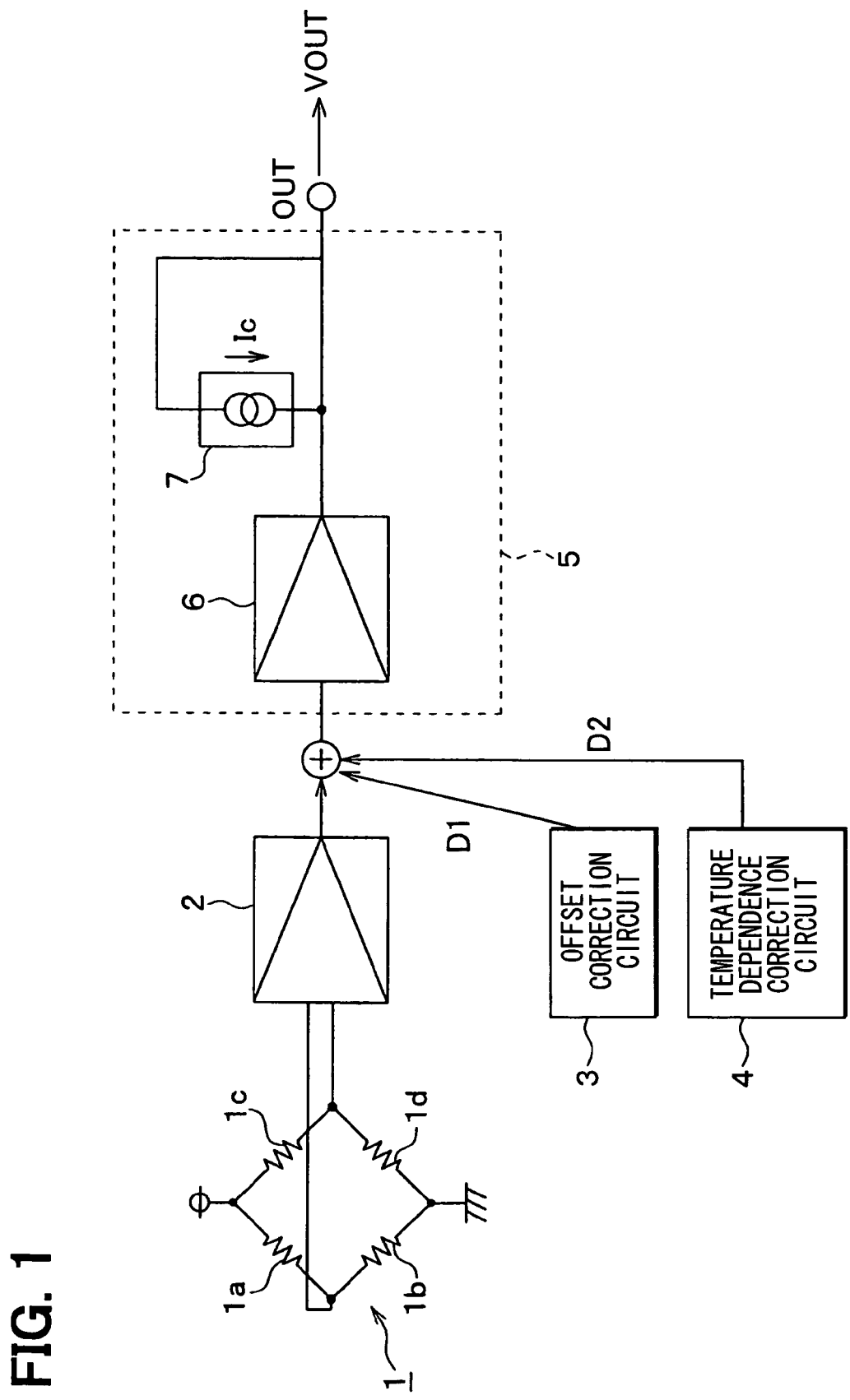
FIG. 1 is a block diagram of a pressure sensor having an output circuit according to an embodiment of the present invention.

Referring to FIG. 1, a pressure sensor includes a sensing section 1 and a signal processing section that has an amplifier circuit 2, an offset correction circuit 3, a temperature dependence correction circuit 4, and an output circuit 5.

The sensing section 1 includes strain gauge resistors 1a-1d configured in a Wheatstone bridge on a diaphragm. A potential difference between a first junction between the resistors 1a, 1b and a second junction between the resistors 1c, 1d changes with pressure applied to the diaphragm. Therefore, the potential difference can be used as a pressure signal.

The signal processing section converts the pressure signal to an output signal having a voltage within a predetermined voltage range suitable for an external device (e.g., engine ECU) that uses the pressure signal. Thus, the engine ECU can accurately detect the pressure from the output signal.

The amplifier circuit 2 amplifies the pressure signal output from the sensing section 1 with a predetermined gain.

The offset correction circuit 3 corrects for offset in the pressure signal. The offset is caused from manufacturing variation, for example. The offset correction circuit 3 stores a first correction value D1 for the offset measured in advance and subtracts the first correction value D1 from an output signal of the amplifier circuit 2. Thus, the offset correction circuit 3 corrects for the offset.

The temperature dependence correction circuit 4 corrects for dependence of the offset on temperature. The temperature dependence is caused from various factors. The temperature dependence correction circuit 4 stores a second correction value D2 for the temperature dependence measured in advance and subtracts the second correction value D2 from the output signal of the amplifier circuit 2. Thus, the temperature dependence correction circuit 4 corrects for the temperature dependence.

The output signal of the amplifier circuit 2 is input to the output circuit 5. The output circuit 5 converts the input signal to a signal having the voltage within the predetermined voltage range. The signal is subtracted by the first and second correction values D1, D2 and output from the output circuit 5.

The output circuit 5 includes an amplifier circuit 6 and a constant current circuit 7. During operation of the output circuit 5, a constant current Ic generated by the constant current circuit 7 flows to an output terminal OUT. Thus, when the amplifier circuit 6 amplifies the input signal, an output signal VOUT having the voltage within the predetermined voltage range is generated. The voltage range is specified by upper and lower clamp voltages. A voltage potential of the output terminal OUT is fed back to the constant current circuit 7. Thus, the constant current circuit 7 monitors the voltage potential of the output terminal OUT and changes the amount of the constant current Ic in accordance with the voltage potential.

Figure 2:
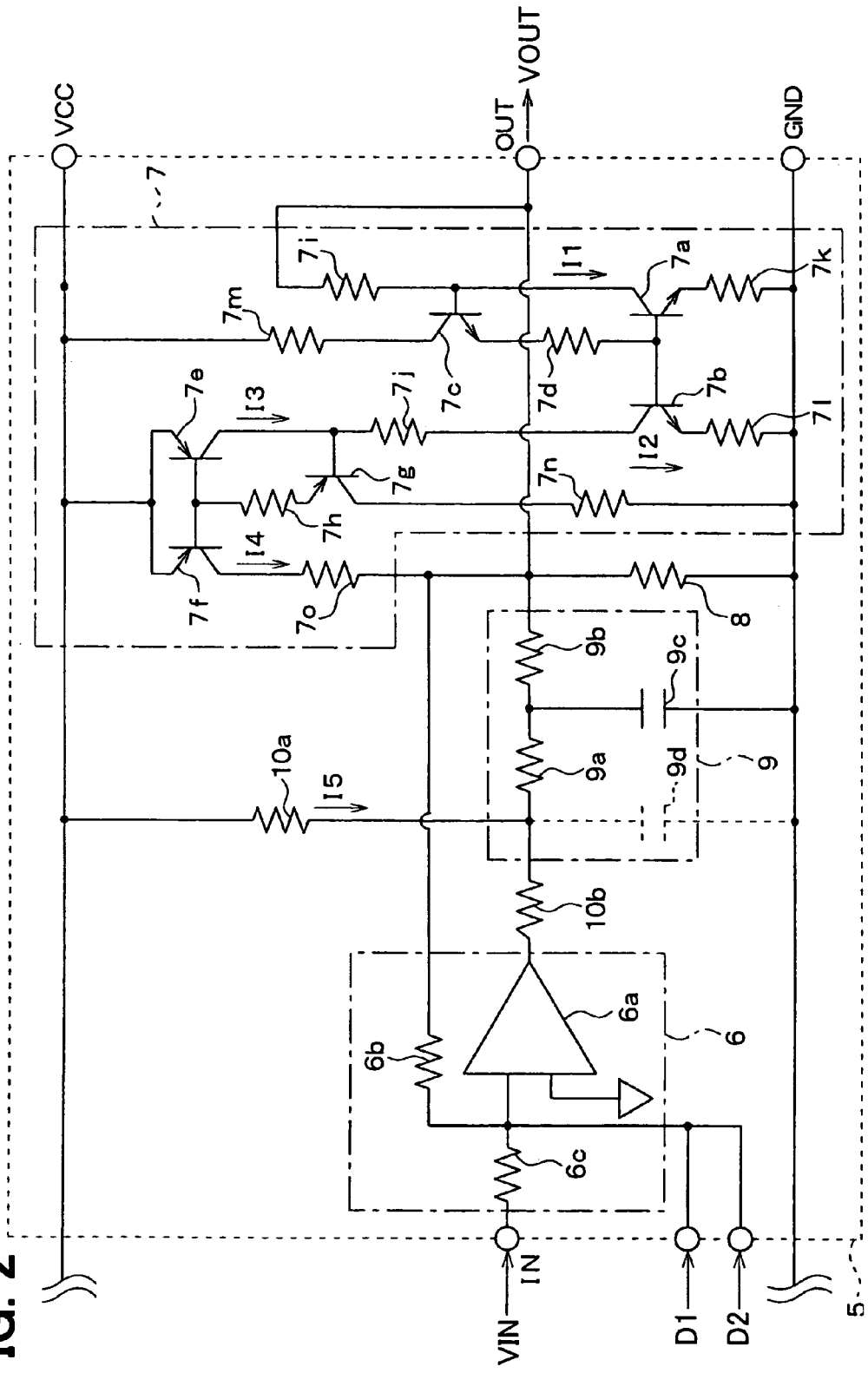
FIG. 2 is a schematic of the output circuit according to the embodiment.

As shown in detail in FIG. 2, the output circuit 5 further includes a resistor 8, a filter circuit 9, and resistors 10a, 10b. The output circuit 5 is powered by a power supply voltage VCC supplied through the engine ECU (not shown). The output circuit 5 converts an input signal VIN applied to an input terminal IN to the output signal VOUT having the voltage within the predetermined voltage range and outputs the output signal VOUT to the engine ECU through the output terminal OUT.

The amplifier circuit 6 includes an operational amplifier 6a and resistors 6b, 6c. The amplifier circuit 6 amplifies the input signal VIN with a gain depending on resistances of the resistors 6b, 6c.

The constant current circuit 7 includes NPN transistors 7a-7c, a resistor 7d, PNP transistors 7e-7g, and resistors 7h-7o.

The bases of the transistors 7a, 7b are coupled to each other and the transistors 7a, 7b construct a first current mirror circuit. The transistor 7c and the resistor 7d reduce error that is introduced in a first mirror ratio of the first current mirror circuit due to a current gain hfe.

The bases of the transistors 7e, 7f are coupled to each other and the transistors 7e, 7f construct a second current mirror circuit. The transistor 7g and the resistor 7h reduce error that is introduced in a second mirror ratio of the second current mirror circuit due to the current gain hfe.

The resistor 8 is used to detect a break in the output circuit 5 and to determine the upper and lower clamp voltages that specify the voltage range of the output signal VOUT.

The filter circuit 9 includes resistors 9a, 9b and a capacitor 9c and acts as a RC filter circuit. The filter circuit 9 eliminates high frequency noise corresponding to an electromagnetic compatibility (EMC) noise such as a magnetic noise coming from other electronic devices and increases resistance of the output circuit 5 to the EMC noise. The filter circuit 9 has a filter constant depending on the resistance of the resistors 9a, 9b and the capacitance of the capacitor 9c. The filter circuit 9 prevents a noise signal within a certain frequency range to enter the output circuit 5 through the output terminal OUT based on the filter constant.

The resistor 10a is used to determine the upper and lower clamp voltages, to adjust the amount of current flow to the output terminal OUT, and to detect the break in the output circuit 5. The resistor 10b is used to determine the lower clamp voltage.

The pressure sensor having the output circuit 5 operates as follows:

When the pressure is applied to the sensing section 1 of the pressure sensor, the potential difference between the first junction between the resistors 1a, 1b and the second junction between the resistors 1c, 1d changes with the applied pressure. The potential difference as the pressure signal is amplified by the amplifier circuit 2 and the pressure signal is input to the output circuit 5.

In the output circuit 5, the input signal VIN is converted to the output signal VOUT having the voltage within the predetermined voltage range. The output signal VOUT is corrected by the first and second correction values D1, D2 and output to the engine ECU through the output terminal OUT.

The output circuit 5 converts the input signal VIN to the output signal VOUT as follows:

The power supply voltage VCC is applied to the constant current circuit 7 and the constant current circuit 7 starts to operate.

When the voltage signal VOUT is small, i.e., a potential difference between the emitter of the transistor 7c and the output terminal OUT is less than a transistor turn-on voltage Vf (e.g., 0.7 volts), the transistor 7c is turned off. As a result, the transistors 7a, 7b are turned off and the transistors 7e, 7f are turned off. In this case, since the constant current circuit 7 generates no current, a slight current flowing through the resistor 6b flows through the resistor 8. Therefore, the voltage signal VOUT has a slight voltage (e.g., 0.1 volt) approximately equal to the ground GND (i.e., 0 volt). In other words, the voltage signal VOUT has the lower clamp voltage of 0.1 volt.

In contrast, when the voltage signal VOUT increases above a voltage 2Vf (i.e., 1.4 volts), the transistor 7c is turned on. As a result, the transistors 7a, 7b are turned on and a collector current I1 flows through the transistor 7a. In this case, the amount of a collector current of the transistor 7c depends on the resistance of the resistor 7m. The transistor 7c reduces the error that is introduced in the first mirror ratio of the first current mirror circuit due to the current gain hfe. The amount of the collector current I1 depends on the resistance of the resistors 7i, 7k. When the collector current I1 flows through the transistor 7a, a collector current I2 flows through the transistor 7b. The collector current I2 mirrors the collector current I1 by the first mirror ratio.

When the transistor 7b is turned on, the transistor 7e is turned on and a collector current I3 flows through the transistor 7e. In this case, the amount of a collector current of the transistor 7g depends on the resistance of the resistor 7n. The transistor 7g reduces the error that is introduced in the second mirror ratio of the second current mirror circuit due to the current gain hfe. The amount of the collector current I3 depends on the resistance of the resistors 7j, 7l. When the collector current I3 flows through the transistor 7e, a collector current I4 flows through the transistor 7f. The collector current I4 mirrors the collector current I3 by the second mirror ratio.

Thus, the constant current circuit 7 supplies the constant current Ic, i.e., the collector current I4 to the output terminal OUT side.

The collector current I4 supplied to the output terminal OUT side generates the output signal VOUT in accordance with the input signal VIN as follows:

When a voltage of the input signal VIN is lower than a predetermined reference voltage, the output voltage of the operational amplifier 6a is higher than the voltage of the output signal VOUT. In this case, an electric current flows from the output terminal side of the operational amplifier 6a to the output terminal OUT side. Therefore, an output current of the operational amplifier 6a, a current I5 flowing through the resistor 10a, and the collector current I4 flows to the output terminal OUT side, the resistor 6b side, and the resistor 8 side. The output signal VOUT is obtained as a voltage drop across the resistor 8. Thus, the collector current I4 supplied to the output terminal OUT side generates the output signal VOUT in accordance with the input signal VIN.

Figure 4:
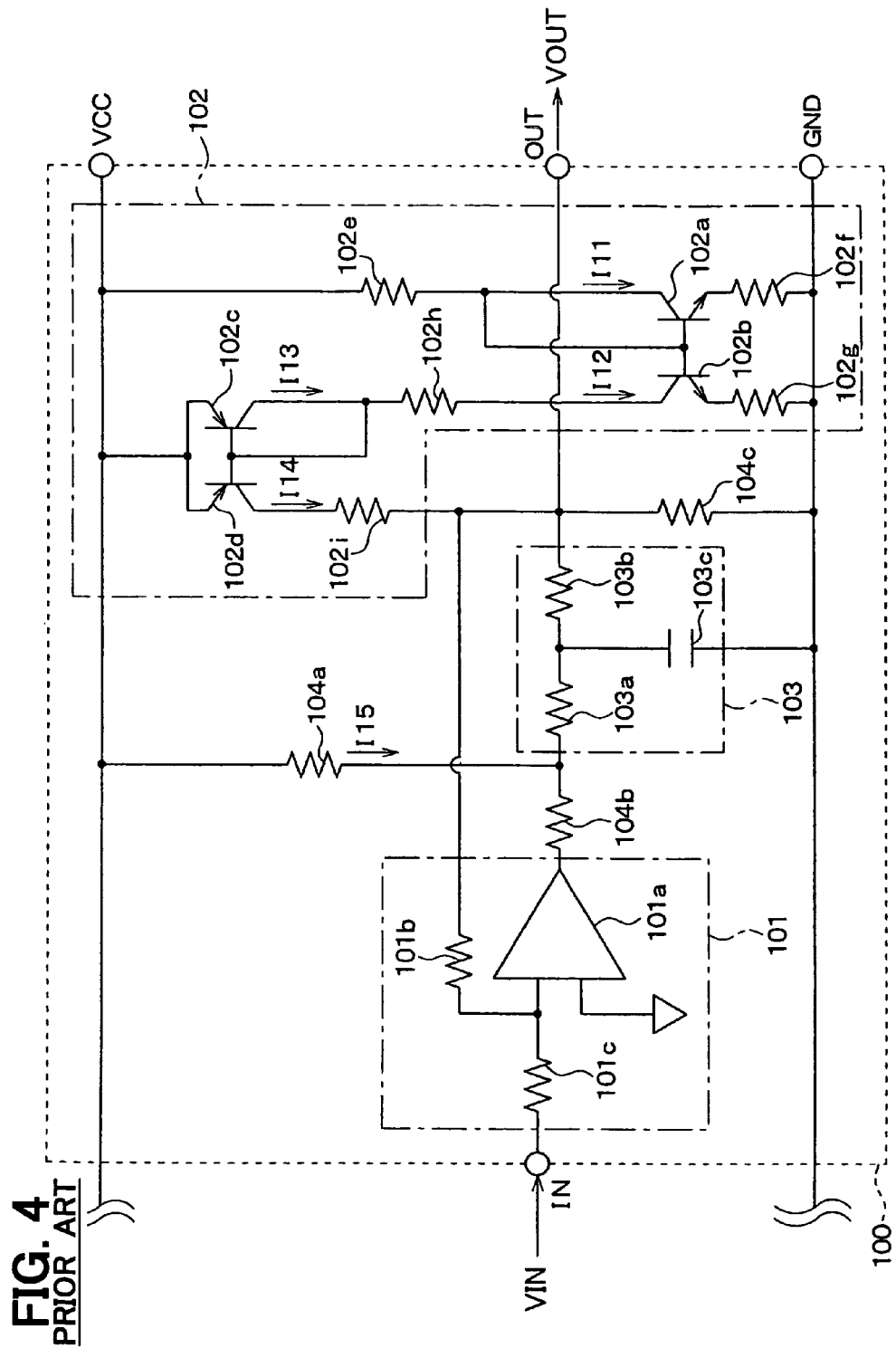
FIG. 4 is a schematic of a conventional output circuit.

The collector current I1 increases with an increase in the output signal VOUT. The collector current I4 increases with the increase in the collector current I1. The voltage drop across the resistor 8 increases with the increase in the collector current I4. In the output circuit 5 shown in FIG. 2, thus, the upper clamp voltage has a high value as compared to in the conventional output circuit 100 shown in FIG. 4.

Figure 3:
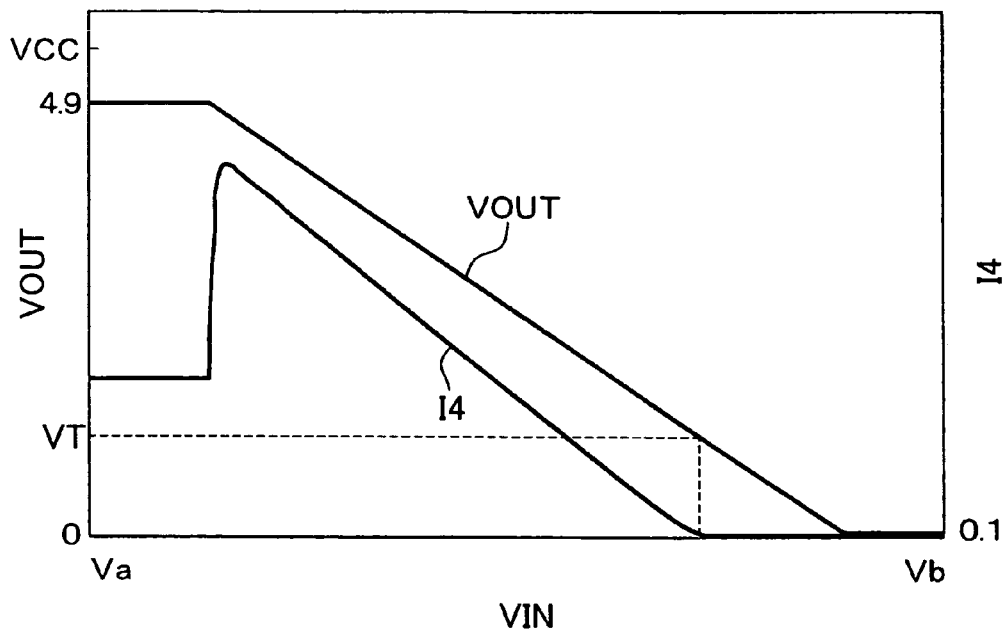
FIG. 3 is a graph showing a relationship between an input signal, an output signal, and a constant current in the output circuit of FIG. 2.
Figure 5:
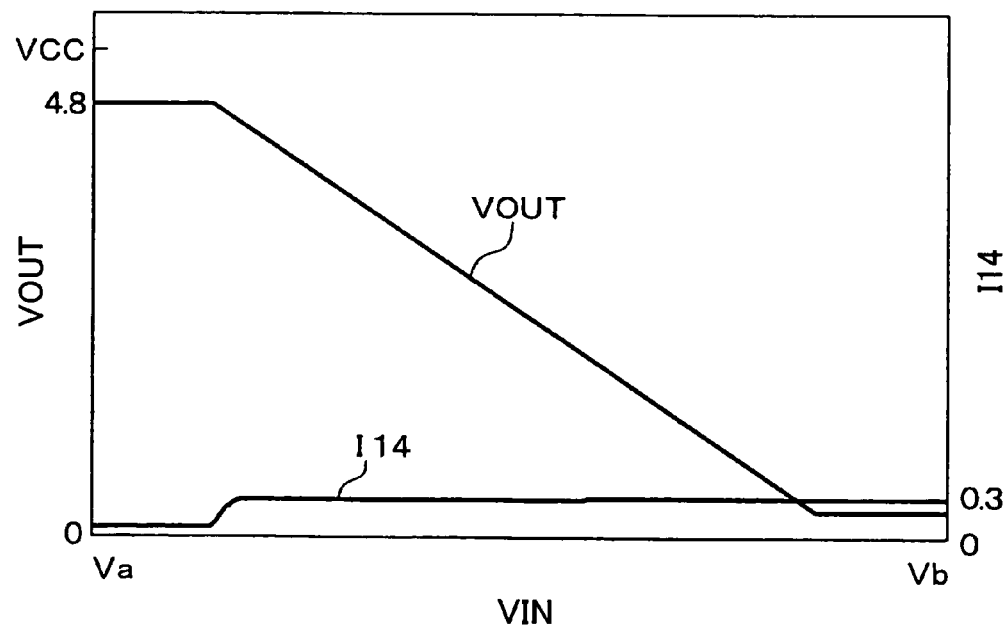
FIG. 5 is a graph showing a relationship between an input signal, an output signal, and a constant current in the conventional output circuit of FIG. 4.

As shown in FIG. 3, when the voltage of the input signal VIN increases from a voltage Va to a voltage Vb, the voltage of the output signal VOUT changes from 4.9 volts to 0.1 volt. Therefore, the voltage range of the output signal VOUT in the output circuit 5 is larger than that in the conventional output circuit 100.

In the output circuit 5, the output signal VOUT changes with the change in the input signal VIN and the constant current I4 changes with the change in the output signal VOUT. As can been seen from FIG. 3, when the output signal VOUT decreases below a threshold voltage VT, the constant current I4 becomes zero so that the lower clamp voltage is close to the ground GND. As the output signal VOUT increases, the constant current I4 increases so that the upper clamp voltage is close to the power supply voltage VCC. For example, when the power supply voltage VCC is 5 volts, the upper clamp voltage is approximately 4.9 volts. The upper and lower clamp voltages change with the resistance in the output circuit 5. If the resistors 7o, 10b are eliminated from the output circuit 5, the output signal VOUT ranges from 0.05 volts to 4.99 volts. In other words, the upper clamp voltage is 4.99 volts and the lower clamp voltage is 0.05 volts.

As described above, in the output circuit 5 according to the embodiment, the output signal VOUT is fed back to the constant current circuit 7. Thus, the constant current circuit 7 monitors the output signal VOUT and changes the amount of the collector current I4 in accordance with the voltage of the output signal VOUT. When the output signal VOUT decreases to or below the threshold voltage VT, the constant current circuit 7 is turned off and the collector current I4 becomes zero. Thus, the lower clamp voltage is made as close to the ground GND as possible.

As the constant current I4 increases, the output signal VOUT increases and the voltage drop across the resistor 8 increases. Thus, the upper clamp voltage is made as close to the power supply voltage VCC as possible.

In the output circuit 5, therefore, the output signal VOUT can have a high value within the predetermined voltage range, as compared to in the conventional output circuit 100.

(Modifications)

The embodiments described above may be modified in various ways. For example, the bipolar transistors such as the transistor 7a can be replaced with a metal oxide semiconductor (MOS) transistor.

The filter circuit 9 may further include a capacitor 9d drawn by a dashed line in FIG. 2 and act as a two-stage RC filter circuit.

The resistor 8 can be eliminated from the output circuit 5.

Such changes and modifications are to be understood as being within the scope of the present invention as defined by the appended claims.

What is claimed is:

1. An output circuit for converting an input signal to an output signal having a voltage within a predetermined voltage range, the output circuit comprising:
   an input terminal that receives the input signal;
   an output terminal that outputs the output signal;
   a current source circuit that generates a control current based on which the input signal is converted to the output signal;
   an amplifier circuit that amplifies the input signal;
   a filter circuit connected between the amplifier circuit and the output terminal to prevent a noise signal within a predetermined frequency range from entering through the output terminal; and
   a first resistor through which both an output current of the filter circuit and the control current flow, wherein
   the current source circuit supplying the control current to the output terminal, wherein the output signal is fed back to the current source circuit,
   the current source circuit changes the amount of the control current in accordance with the voltage of the output signal such that the control current increases with an increase in the voltage of the output signal and becomes zero when the voltage of the output signal decreases to or below a predetermined threshold voltage, and
   the output signal is a voltage drop across the first resistor.

2. An output circuit for converting an input signal to an output signal having a voltage within a predetermined voltage range, the output circuit comprising:
   an input terminal that receives the input signal;
   an output terminal that outputs the output signal; and
   a current source circuit that generates a control current based on which the input signal is converted to the output signal, wherein
   the current source circuit supplying the control current to the output terminal, wherein the output signal is fed back to the current source circuit,
   the current source circuit changes the amount of the control current in accordance with the voltage of the output signal such that the control current increases with an increase in the voltage of the output signal and becomes zero when the voltage of the output signal decreases to or below a predetermined threshold voltage,
   the current source circuit includes a first current mirror circuit having first input and output transistors and a second current mirror circuit having second input and output transistors,
   the first output transistor of the first current mirror circuit is connected in series with the second input transistor of the second current mirror circuit,
   a first current flowing through the first input transistor increases with the increase in the voltage of the output signal, and
   a second current flowing through the second output transistor is the control current.

3. The output circuit according to claim 2, wherein
   the first input and output transistors are first and second NPN bipolar transistors, respectively, and
   the second input and output transistors are first and second PNP bipolar transistors, respectively.

4. The output circuit according to claim 3, wherein
   the current source circuit further includes a third NPN bipolar transistor and second and third resistors, and
   the third NPN bipolar transistor has a base connected between the output terminal and a collector of the first input transistor, an emitter connected to a base of the first input transistor through the second resistor, and a collector to which a power supply voltage is applied through the third resistor.

5. The output circuit according to claim 3, wherein
   the constant current circuit further includes a third PNP bipolar transistor and fourth and fifth resistors, and
   the third PNP bipolar transistor has a base connected to a collector of the second input transistor, an emitter connected to a base of the second input transistor through the fourth resistor, and a collector connected to ground through the fifth resistor.

6. An output circuit for converting an input signal to an output signal having a voltage within a predetermined voltage range, the output circuit comprising:
   an input terminal that receives the input signal;
   an output terminal that outputs the output signal;
   a current source circuit that generates a control current and supplies the control current to the output terminal;
   an amplifier circuit that amplifiers the input signal;
   a filter circuit connected between the amplifier circuit and the output terminal to prevent a noise signal within a predetermined frequency range from entering through the output terminal; and
   a first resistor through which both an output current of the filter circuit and the control current flow, wherein
   the input signal is converted to the output signal based on the control current supplied to the output terminal,
   the output signal is fed back to the current source circuit,
   the control current generated by the current source circuit varies in accordance with the a feedback voltage of the fed back output signal, the control current increases with an increase in the feedback voltage, when the feedback voltage is above a predetermined threshold voltage, and
the control current becomes zero, when the feedback voltage is equal to or below the threshold voltage,
the output signal is a voltage drop across the first resistor.

7. An output circuit for converting an input signal to an output signal having a voltage within a predetermined voltage range, the output circuit comprising:
an input terminal that receives the input signal;
an output terminal that outputs the output signal; and
a current source circuit that generates a control current and supplies the control current to the output terminal, wherein
the input signal is converted to the output signal based on the control current supplied to the output terminal,
the output signal is fed back to the current source circuit,
the control current generated by the current source circuit varies in accordance with the a feedback voltage of the fed back output signal,
the control current increases with an increase in the feedback voltage, when the feedback voltage is above a predetermined threshold voltage,
the control current becomes zero, when the feedback voltage is equal to or below the threshold voltage,
the current source circuit includes a first current mirror circuit having first input and output transistors and a second current mirror circuit having second input and output transistors,
the first output transistor of the first current mirror circuit is connected in series with the second input transistor of the second current mirror circuit,
a first current flowing through the first input transistor increases with the increase in the voltage of the output signal, and
a second current flowing through the second output transistor is the control current.

8. The output circuit according to claim 7, wherein
the first input and output transistors are first and second NPN bipolar transistors, respectively, and
the second input and output transistors are first and second PNP bipolar transistors, respectively.

9. The output circuit according to claim 8, wherein
the current source circuit further includes a third NPN bipolar transistor and second and third resistors, and
the third NPN bipolar transistor has a base connected between the output terminal and a collector of the first input transistor, an emitter connected to a base of the first input transistor through the second resistor, and a collector to which a power supply voltage is applied through the third resistor.

10. The output circuit according to claim 8, wherein
the constant current circuit further includes a third PNP bipolar transistor and fourth and fifth resistors, and
the third PNP bipolar transistor has a base connected to a collector of the second input transistor, an emitter connected to a base of the second input transistor through the fourth resistor, and a collector connected to ground through the fifth resistor.

11. An integrated circuit comprising:
a current-generating circuit configured to generate a current and supply the current to an output terminal;
a feedback circuit configured to feed an output voltage from the output terminal back to the current-generating circuit;
an amplifier circuit that amplifies the input signal;
a filter circuit connected between the amplifier circuit and the output terminal to prevent a noise signal within a predetermined frequency range from entering through the output terminal; and
a first resistor through which both an output current of the filter circuit and the control current flow, wherein
the current generated by the current-generating circuit varies in accordance with the fed back output voltage,
when the output voltage is above a predetermined threshold voltage, the current increases when the output voltage increases,
when the output voltage is equal to or below the threshold voltage current, the current becomes zero, and
the output signal is a voltage drop across the first resistor.

12. An integrated circuit comprising:
a current-generating circuit configured to generate a current and supply the current to an output terminal; and
a feedback circuit configured to feed an output voltage from the output terminal back to the current-generating circuit, wherein
the current generated by the current-generating circuit varies in accordance with the fed back output voltage,
when the output voltage is above a predetermined threshold voltage, the current increases when the output voltage increases,
when the output voltage is equal to or below the threshold voltage current, the current becomes zero,
the current generating circuit includes a first current mirror circuit having first input and output transistors and a second current mirror circuit having second input and output transistors,
the first output transistor of the first current mirror circuit is connected in series with the second input transistor of the second current mirror circuit,
a first current flowing through the first input transistor increases with the increase in the voltage of the output signal, and
a second current flowing through the second output transistor is the control current.

13. The integrated circuit according to claim 12, wherein
the first input and output transistors are first and second NPN bipolar transistors, respectively, and
the second input and output transistors are first and second PNP bipolar transistors, respectively.

14. The integrated source according to claim 13, wherein
the current source circuit further includes a third NPN bipolar transistor and second and third resistors, and
the third NPN bipolar transistor has a base connected between the output terminal and a collector of the first input transistor, an emitter connected to a base of the first input transistor through the second resistor, and a collector to which a power supply voltage is applied through the third resistor.

15. The integrated source according to claim 13, wherein
the constant current circuit further includes a third PNP bipolar transistor and fourth and fifth resistors, and
the third PNP bipolar transistor has a base connected to a collector of the second input transistor, an emitter connected to a base of the second input transistor through the fourth resistor, and a collector connected to ground through the fifth resistor.

* * * * *